(12) United States Patent
Yamada et al.

(10) Patent No.: US 8,802,334 B2
(45) Date of Patent: Aug. 12, 2014

(54) SURFACE TREATMENT METHOD FOR A MASK BLANK, METHOD OF MANUFACTURING A MASK BLANK, AND METHOD OF MANUFACTURING A MASK

(75) Inventors: Takeyuki Yamada, Shinjuku-ku (JP); Toshiyuki Suzuki, Shinjuku-ku (JP); Masahiro Hashimoto, Shinjuku-ku (JP); Yasunori Yokoya, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 13/440,539

(22) Filed: Apr. 5, 2012

(65) Prior Publication Data

US 2012/0258388 A1 Oct. 11, 2012

(30) Foreign Application Priority Data

Apr. 6, 2011 (JP) ................................. 2011-084782
Apr. 6, 2011 (JP) ................................. 2011-084783
Apr. 6, 2011 (JP) ................................. 2011-084784

(51) Int. Cl.
*G03F 1/00* (2012.01)

(52) U.S. Cl.
USPC ...................................... 430/5; 216/12; 134/1

(58) Field of Classification Search
USPC ...................................... 430/5; 216/12; 134/1
See application file for complete search history.

(56) References Cited

U.S. PATENT DOCUMENTS 7,618,753 B2 11/2009 Yoshikawa et al.
2007/0259276 A1* 11/2007 Yoshikawa et al. ............... 430/5

FOREIGN PATENT DOCUMENTS

JP 2006-078825 A 3/2006

* cited by examiner

*Primary Examiner* — Stewart Fraser
(74) *Attorney, Agent, or Firm* — Sughrue Mion, PLLC

(57) ABSTRACT

Provided is a mask blank surface treatment method for surface-treating, using a treatment liquid, a surface of a thin film, to be formed into a transfer pattern, of a mask blank having the thin film on a substrate. The thin film is made of a material that can be etched by ion-based dry etching. The concentration of an etching inhibitor contained in the treatment liquid is 0.3 ppb or less.

18 Claims, 5 Drawing Sheets

SURFACE TREATMENT METHOD FOR A MASK BLANK, METHOD OF MANUFACTURING A MASK BLANK, AND METHOD OF MANUFACTURING A MASK

This application is based upon and claims the benefit of priority from Japanese Patent Application No. 2011-084782, filed on Apr. 6, 2011, Japanese Patent Application No. 2011-084783, filed on Apr. 6, 2011, and Japanese Patent Application No. 2011-084784, filed on Apr. 6, 2011, the disclosures of which are incorporated herein in their entirety by reference.

TECHNICAL FIELD

This invention relates to a photomask for use as a mask in, for example, transferring a fine pattern in the manufacture of a semiconductor device and to a surface treatment method for a photomask blank as an intermediate product that can be formed into the photomask by applying certain treatments thereto, and further relates to a method of manufacturing a photomask blank which is surface-treated using a treatment liquid, and to a method of manufacturing a photomask using the surface-treated photomask blank.

BACKGROUND ART

In general, fine pattern formation is carried out by photolithography in the manufacture of a semiconductor device or the like. In a fine pattern transfer process where the photolithography is carried out, a photomask is used as a mask. The photomask is generally obtained by forming a desired fine pattern in a light-shielding film or the like of a photomask blank as an intermediate product. As a consequence, the properties of the light-shielding film or the like of the photomask blank as the intermediate product almost exactly determine the performance of the obtained photomask. Conventionally, Cr has generally been used as the light-shielding film of the photomask blank.

In the meantime, in recent years, pattern miniaturization has advanced more and more and, following this, a problem such as resist collapse has arisen with the thickness of a conventional resist film. This will be explained hereinbelow. In the case of a light-shielding film mainly composed of Cr, either wet etching or dry etching can be used as etching after forming a transfer pattern in a resist film by EB (electron beam) writing or the like. However, in the case of the wet etching, the etching tends to proceed isotropically and thus it has become difficult to cope with the recent pattern miniaturization while the dry etching that tends to be anisotropic has become dominant.

In dry-etching a light-shielding film mainly composed of Cr, a mixed gas of chlorine-based gas and oxygen gas is generally used as an etching gas. However, a conventional resist film of an organic material has a property of being easily etched with the oxygen gas and thus the etching rate of the organic material resist film is much higher than that of the light-shielding film mainly composed of Cr. Since the resist film should remain until completion of patterning, by dry etching, of the light-shielding film mainly composed of Cr, the thickness of the resist film in the case of the light-shielding film mainly composed of Cr is required to be very large (e.g. three times the thickness of the light-shielding film mainly composed of Cr).

In recent years, the pattern miniaturization has been significant and there have been instances where, in a resist film having a transfer pattern formed by EB writing or the like, the height or thickness of the resist film is much greater than the width thereof at its portion where the pattern is dense, so that the resist film collapses or is stripped due to its instability during development or the like. If this occurs, the transfer pattern is not correctly formed in a light-shielding film mainly composed of Cr, thus resulting in a defective photomask. Therefore, the reduction in thickness of the resist film has been the overriding subject to be solved. For reducing the thickness of the resist film in the case of the light-shielding film mainly composed of Cr, it has been necessary to reduce the thickness of the light-shielding film. However, for the light-shielding film mainly composed of Cr, its thickness has already reached a limit where the light-shielding performance becomes insufficient.

JP-A-2006-78825 (Patent Document 1) discloses that a Ta metal film has an extinction coefficient (light absorbance) equal to or greater than that of a Cr metal film for light having a wavelength of 193 nm which is used in ArF excimer laser exposure. Patent Document 1 further discloses a photomask blank that enables precise formation of a fine photomask pattern by reducing the load to a resist which is used as a mask in the photomask pattern formation. This photomask blank comprises a light-shielding layer in the form of a metal film that is not substantially etched by oxygen-containing chlorine-based ((Cl+O)-based) dry etching, but can be etched by oxygen-free chlorine-based (Cl-based) dry etching and fluorine-based (F-based) dry etching, and an antireflection layer in the form of a metal compound film that is not substantially etched by oxygen-free chlorine-based (Cl-based) dry etching, but can be etched by at least one of oxygen-containing chlorine-based ((C+O)-based) dry etching and fluorine-based (F-based) dry etching.

Normally, before forming a resist, a photomask blank is cleaned using cleaning water or a cleaning liquid containing a surfactant for the purpose of removing particles present on a surface of the photomask blank. Further, in order to prevent the occurrence of stripping or collapse of a fine pattern in later processes, surface treatment is carried out for reducing the surface energy of the photomask blank surface. As the surface treatment, the photomask blank surface is, for example, alkylsilylated with hexamethyldisilazane (HMDS) or another organic silicon-based surface treatment agent.

A defect inspection of the photomask blank is carried out before or after forming the resist and, if the desired specification (quality) is satisfied, a photomask is manufactured through later-described processes. The resist formed on the photomask blank is subjected to writing, development, and rinsing and, after forming a resist pattern, an antireflection layer is patterned by oxygen-containing chlorine-based dry etching or fluorine-based dry etching using the resist pattern as a mask to thereby form an antireflection layer pattern. Then, using the antireflection layer pattern as a mask, a light-shielding layer is patterned by oxygen-free chlorine-based dry etching to thereby form a light-shielding layer pattern, and finally the resist is removed. In this manner, the photomask is manufactured. The manufactured photomask is subjected to an inspection using a mask defect inspection apparatus to check whether or not there is a black or white defect and, if the defect is detected, correction is properly performed.

SUMMARY OF THE INVENTION

When materials that enable highly anisotropic dry etching are used as materials of the light-shielding layer and the antireflection layer of the photomask blank disclosed in Patent Document 1, i.e. when the light-shielding layer etchable by oxygen-free chlorine-based dry etching and fluorine-based dry etching and the antireflection layer etchable by fluorine-based dry etching are combined together, there has arisen a problem that a micro black defect is present which is not detected in a defect inspection of the photomask blank, but is first detected in a defect inspection of a photomask after it is manufactured from the photomask blank. This also applies to the case where materials having different etching selectivities are used as materials of the light-shielding layer and the antireflection layer, i.e. where the light-shielding layer etchable by oxygen-free chlorine-based dry etching and the antireflection layer etchable by fluorine-based dry etching are combined together. Also in this case, there has arisen a problem that a micro black defect is present which is not detected in a defect inspection of the photomask blank, but is first detected in a defect inspection of a photomask after it is manufactured from the photomask blank.

Micro black defects are dotted, i.e. are present in spots, in a region where a substrate is exposed due to patterning of a thin film. The micro black defects each have a size of 20 to 100 nm with a height corresponding to the thickness of the thin film and are first recognized in the manufacture of a photomask for the semiconductor design rule DRAM half-pitch 32 nm node and beyond. The micro black defects should all be removed/corrected because they act as serious defects in the manufacture of a semiconductor device. However, if the number of the defects exceeds 50, the load of defect correction is so large as to make it practically difficult to perform the defect correction. Further, with the increasing integration of semiconductor devices in recent years, the defect removal/correction is reaching its limit due to complication (e.g. OPC (optical proximity correction)), miniaturization (e.g. SRAF (sub-resolution assist features) such as assist bars), and narrowing of a thin film pattern of a photomask, which is becoming a problem.

This invention aims to solve the above-mentioned problems and a first object of this invention is to provide a mask blank surface treatment method that can suppress the occurrence of a latent defect on a mask blank which is not detected in a defect inspection of the mask blank, but causes the occurrence of a micro black defect of a mask.

A second object of this invention is to provide a mask blank manufacturing method that can suppress the occurrence of a latent defect on a mask blank which is not detected in a defect inspection of the mask blank, but causes the occurrence of a micro black defect of a mask.

A third object of this invention is to provide a mask manufacturing method that can reduce the load of mask defect correction and that can prevent the occurrence of a micro black defect whose correction is impossible.

As a result of investigating the cause of the occurrence of a micro black defect of a mask, the present inventors have found that one cause is a latent defect on a mask blank which is not detected in a defect inspection of the mask blank.

Then, the present inventors have found that the latent defect on the mask blank comprises an etching inhibitor and that the etching inhibitor is contained, although only in a very small amount, in a treatment liquid (e.g. a cleaning liquid) which is used in surface treatment of a surface of a thin film of the mask blank. Details of the etching inhibitor will be described later.

Further, the present inventors have confirmed that it is possible to reduce micro black defects of a mask by reducing the concentration of an etching inhibitor contained in a treatment liquid which is used in surface treatment of a mask blank in which a thin film to be formed into a transfer pattern is formed on a substrate.

As means for achieving the above-mentioned objects, this invention has the following structures.

(Structure 1)

A mask blank surface treatment method for surface-treating, using a treatment liquid, a surface of a thin film, to be formed into a transfer pattern, of a mask blank having the thin film on a substrate, wherein the thin film is made of a material that can be etched by ion-based dry etching, and a concentration of an etching inhibitor contained in the treatment liquid is 0.3 ppb or less.

(Structure 2)

A mask blank surface treatment method for surface-treating, using a treatment liquid, a surface of a thin film, to be formed into a transfer pattern, of a mask blank having the thin film on a substrate, wherein the thin film is made of a material that can be etched by ion-based dry etching, and a concentration of an etching inhibitor contained in the treatment liquid is set so that the number of convex portions that remain on a surface of the substrate after removing the surface-treated thin film by etching with a dry etching gas which enables the ion-based dry etching becomes 200 or less in a transfer pattern forming region.

(Structure 3)

The mask blank surface treatment method according to Structure 1 or 2, wherein the etching inhibitor is an organic or inorganic material having a resistance to a dry etching gas.

(Structure 4)

The mask blank surface treatment method according to any one of Structures 1 to 3, wherein the etching inhibitor is a material containing at least one selected from calcium, magnesium, iron, copper, manganese, aluminum, and compounds thereof.

(Structure 5)

The mask blank surface treatment method according to any one of Structures 1 to 4, wherein the etching inhibitor is a material containing at least one selected from calcium, magnesium, aluminum, and compounds thereof.

(Structure 6)

The mask blank surface treatment method according to any one of Structures 1 to 5, wherein the material of the thin film can be etched with a dry etching gas in the form of a fluorine-based gas or a chlorine-based gas substantially free of oxygen.

(Structure 7)

The mask blank surface treatment method according to any one of Structures 1 to 6, wherein the material of the thin film contains tantalum.

(Structure 8)

The mask blank surface treatment method according to any one of Structures 1 to 7, wherein the thin film is a laminated film in which a tantalum nitride film containing tantalum and nitrogen and a tantalum oxide film containing tantalum and oxygen are laminated together.

(Structure 9)

The mask blank surface treatment method according to any one of Structures 1 to 8, wherein the treatment liquid is a cleaning liquid.

(Structure 10)

The mask blank surface treatment method according to Structure 9, wherein the cleaning liquid contains a surfactant.

(Structure 11)

The mask blank surface treatment method according to Structure 9, wherein the cleaning liquid is deionized water.

(Structure 12)

A mask blank manufacturing method comprising a step of preparing a mask blank having on a substrate a thin film to be formed into a transfer pattern, and a surface treatment step of surface-treating a surface of the thin film using a treatment liquid, wherein the thin film is made of a material that can be etched by ion-based dry etching, and the surface treatment step is carried out by the mask blank surface treatment method according to any one of Structures 1 to 11.

(Structure 13)

A mask manufacturing method that manufactures a mask by patterning the thin film of the mask blank manufactured by the mask blank manufacturing method according to Structure 12.

According to this invention, it is possible to provide a mask blank surface treatment method that can suppress the occurrence of a latent defect on a mask blank which is not detected in a defect inspection of the mask blank, but causes the occurrence of a micro black defect of a mask.

According to this invention, it is possible to provide a mask blank manufacturing method that can suppress the occurrence of a latent defect on a mask blank which is not detected in a defect inspection of the mask blank, but causes the occurrence of a micro black defect of a mask.

According to this invention, it is possible to provide a mask manufacturing method that can reduce the load of mask defect correction and that can prevent the occurrence of a micro black defect whose correction is impossible.

DETAILED DESCRIPTION OF THE INVENTION

Figure 1:
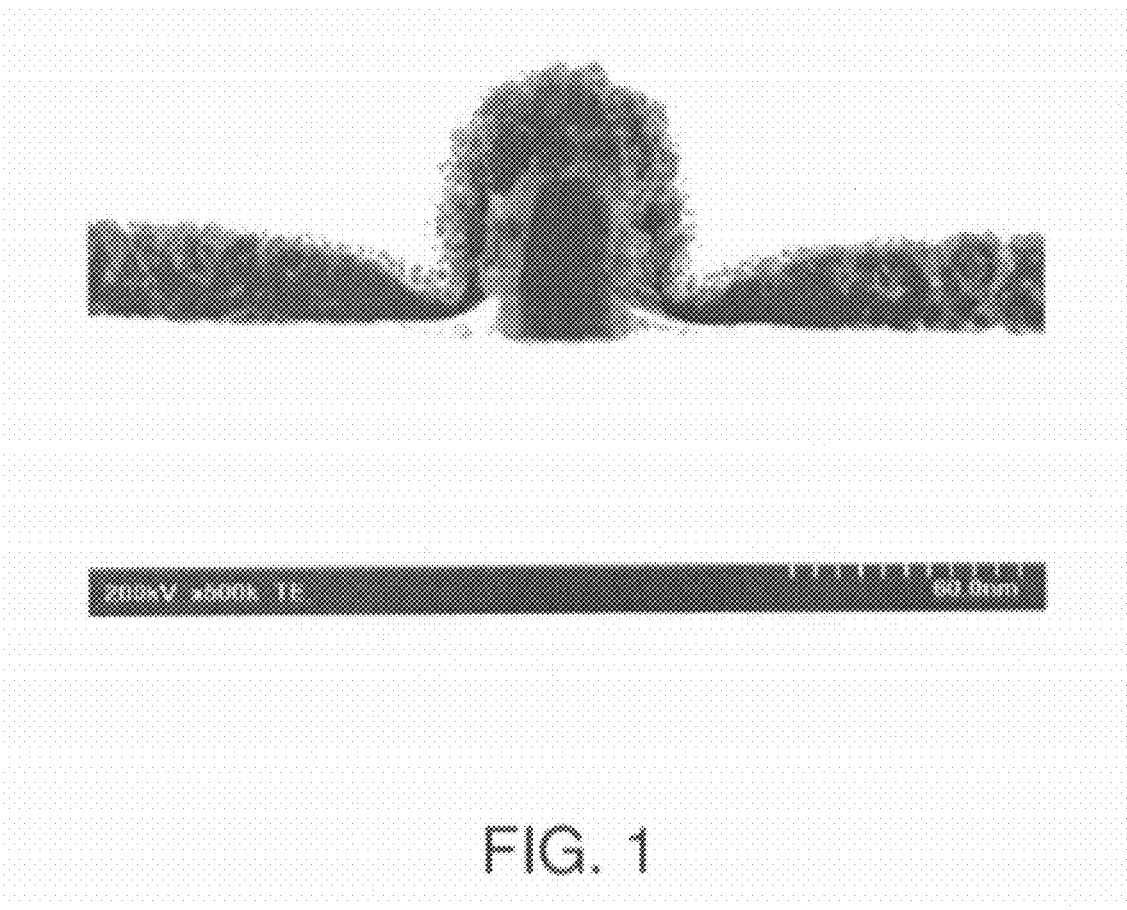
FIG. 1 is a cross-sectional photograph obtained by observing a micro black defect in bright field using a scanning transmission electron microscope.

Before describing a mask blank surface treatment method, a mask blank manufacturing method, and a mask manufacturing method according to this invention, a description will be given of a test and study which were carried out for examining the cause of the occurrence of a micro black defect of a mask.

In order to examine the cause of the occurrence of a micro black defect of a mask, two kinds of mask blanks were prepared. One is the mask blank formed with a thin film which is to be formed into a transfer pattern and is made of a material that can be etched by ion-based dry etching, while the other is the mask blank formed with a thin film which is to be formed into a transfer pattern and is made of a material that can be etched by radical-based dry etching.

As the former mask blank, there was prepared a binary mask blank having on a transparent substrate a laminated structure of a TaN light-shielding layer (thickness: 42 nm) substantially composed of tantalum and nitrogen and a TaO antireflection layer (thickness: 9 nm) substantially composed of tantalum and oxygen. Hereinafter, this binary mask blank will be referred to as a "tantalum-based mask blank" and a mask obtained therefrom will be referred to as a "tantalum-based mask". On the other hand, as the latter mask blank, there was prepared a binary mask blank having on a transparent substrate a laminated structure of a light-shielding layer comprising a CrCON film (thickness: 38.5 nm) substantially composed of chromium, oxygen, nitrogen, and carbon and a CrON film (thickness: 16.5 nm) substantially composed of chromium, oxygen, and nitrogen, and a CrCON antireflection layer (thickness: 14 nm) substantially composed of chromium, oxygen, nitrogen, and carbon. Hereinafter, this binary mask blank will be referred to as a "chromium-based mask blank" and a mask obtained therefrom will be referred to as a "chromium-based mask".

With respect to these two kinds of binary mask blanks, an alkaline cleaning liquid containing a surfactant was supplied to the mask blank surfaces to carry out surface treatment for the purpose of removing foreign matter (particles) adhering to the antireflection layers and foreign matter (particles) incorporated in the light-shielding layers and the antireflection layers.

The surface-treated mask blank surfaces were subjected to a defect inspection using a mask blank defect inspection apparatus (M1350: manufactured by Lasertec Corporation). As a result, no defects such as particles or pinholes were confirmed on the mask blank surfaces.

Masks were manufactured using these two kinds of mask blanks, respectively. With respect to the former tantalum-based mask blank, a resist pattern was formed on the mask blank surface. Then, dry etching using a fluorine-based ($CF_4$) gas was carried out using the resist pattern as a mask, thereby patterning the antireflection layer. Then, dry etching using a chlorine-based ($Cl_2$) gas was carried out to pattern the light-shielding layer. Finally, the resist pattern was removed to obtain a tantalum-based mask.

With respect to the latter chromium-based mask blank, a resist pattern was formed on the mask blank surface. Then, dry etching using a mixed gas of chlorine-based ($Cl_2$) gas and oxygen ($O_2$) gas was carried out using the resist pattern as a mask, thereby patterning the antireflection layer and the light-shielding layer. Finally, the resist pattern was removed to obtain a chromium-based mask.

The obtained two kinds of masks were subjected to a defect inspection using a mask defect inspection apparatus (manufactured by KLA-Tencor Corporation). As a result, it was confirmed that many (more than 50) micro black defects were present on the tantalum-based mask manufactured by the ion-based dry etching. On the other hand, micro black defects were hardly observed on the chromium-based mask manufactured by the radical-based dry etching. It is to be noted that even if UV treatment, ozone treatment, or heat treatment, which is for the purpose of removing contaminants, was carried out before forming the resist pattern, more specifically, before forming a resist film, the same results were obtained.

With respect to the tantalum-based mask blank, the light-shielding film and the antireflection layer were respectively made of the materials containing tantalum and, therefore, as described above, the TaO antireflection layer substantially composed of tantalum and oxygen can be etched with the dry etching gas in the form of the fluorine-based gas while the TaN light-shielding layer substantially composed of tantalum and nitrogen can be etched with the dry etching gas in the form of the chlorine-based gas substantially free of oxygen. However, the TaN light-shielding layer can also be etched with the dry etching gas in the form of the fluorine-based gas. Therefore, it is alternatively possible to manufacture a tantalum-based mask by etching, using the resist pattern as a mask, the antireflection layer and the light-shielding layer with the dry etching gas in the form of the fluorine-based gas.

Many micro black defects were also observed in the case of the tantalum-based mask which was manufactured by etching the antireflection layer and the light-shielding layer with the dry etching gas in the form of the fluorine-based gas.

The micro black defect detected by the defect inspection was subjected to cross-sectional observation in bright field using a scanning transmission electron microscope (STEM). The cross-sectional observation was carried out by coating a platinum alloy over the entire surface of the transparent substrate formed with the thin film pattern. FIG. 1 shows a cross-sectional image of the micro black defect.

As a result, it was confirmed that the height of the micro black defect was substantially equal to the thickness of the laminated film of the light-shielding layer and the antireflection layer and, more specifically, it was confirmed that the micro black defect was a stacked structure considered to comprise a core having a size of 23 nm with a height of 43 nm and a surface oxide having a thickness of 5 to 10 nm which was stacked on the core.

Then, in order to specify the cause of the occurrence of the micro black defect of the mask, it was examined whether or not an etching inhibitor, which was not detected by the defect inspection, was present on the mask blank surface.

The mask blank surfaces, which were surface-treated with the treatment liquid, of the two kinds of mask blanks were analyzed by time-of-flight secondary ion mass spectrometry (TOF-SIMS).

As a result, calcium ($Ca^{2+}$) was detected as cations (inorganic) on the surface of the thin film of the tantalum-based mask blank. Further, another tantalum-based mask blank was analyzed by TOF-SIMS in the same manner and, as a result, magnesium ($Mg^{2+}$) and aluminum ($Al^{3+}$) were also detected as cations (inorganic) in addition to calcium ($Ca^{2+}$). On the other hand, no calcium ($Ca^{2+}$), magnesium ($Mg^{2+}$), or aluminum ($Al^{3+}$) was detected on the surface of the thin film of the chromium-based mask blank. Specifically, respective detected values of calcium ($Ca^{2+}$), magnesium ($Mg^{2+}$), and aluminum ($Al^{3+}$) on the surface of the thin film of the chromium-based mask blank were significantly lower than those of the tantalum-based mask blank.

When a surfactant is contained in a treatment liquid for use in surface treatment of a mask blank, calcium (Ca) is contained as certain-amount impurities depending on the kind of surfactant. Therefore, the calcium ($Ca^{2+}$) detected by TOF-SIMS is considered to be calcium contained in the surfactant contained in the cleaning liquid which was used this time. Depending on the kind of surfactant, magnesium (Mg) and aluminum (Al) are also contained as certain-amount impurities. Therefore, it can be presumed that the magnesium ($Mg^{2+}$) and the aluminum ($Al^{3+}$) detected by TOF-SIMS were contained in the surfactant contained in the cleaning liquid which was used this time.

Since the thickness of an etching inhibitor presumed to be adhering to the surface of the thin film of the tantalum-based mask blank is thin, it is difficult to detect it by the mask blank defect inspection apparatus. It is not impossible to specify a portion, where an etching inhibitor is adhering, by scanning the entire surface of the thin film using an atomic force microscope (AFM), but the detection takes an enormous time. In view of this, two thin films each having a thickness of 100 nm and made of a chromium-based material with only a small possibility of adhesion of an etching inhibitor were laminated on the thin film (tantalum-based thin film) of the tantalum-based mask blank having been subjected to the surface cleaning with the cleaning liquid. By this, if there is a convex portion, where an etching inhibitor is present, on the tantalum-based thin film, the height of the convex portion relatively increases due to the so-called decoration effect, so that it is possible to detect it as a convex defect by the mask blank defect inspection apparatus.

Figure 2:
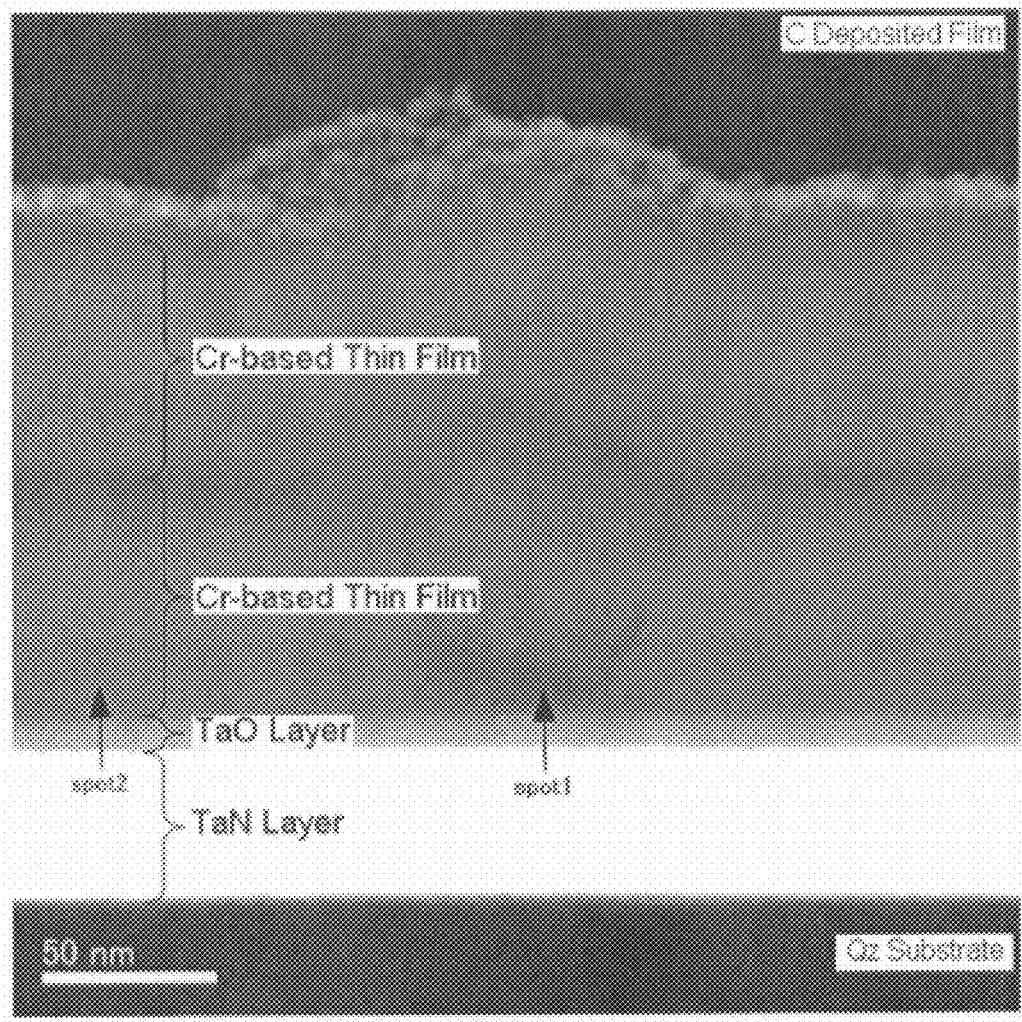
FIG. 2 is a cross-sectional photograph obtained by observing an etching inhibitor, formed on a surface of a tantalum-based mask blank, in dark field using a scanning transmission electron microscope.

Using this technique, a defect inspection was carried out using the mask blank defect inspection apparatus, thereby specifying the positions of all convex defects. A plurality of the specified convex defects were subjected to cross-sectional observation in dark field using a scanning transmission electron microscope (STEM). As a result, it was confirmed that a layer of an etching inhibitor was formed on the surface of the tantalum-based thin film (see FIG. 2). In this event, an element forming the etching inhibitor was also analyzed using an energy dispersive X-ray spectrometer (EDX) attached to STEM. The analysis by EDX was carried out for a portion on the surface of the tantalum-based thin film where the presence of the etching inhibitor was confirmed (i.e. a portion indicated by symbol spot 1 in FIG. 2) and, as reference data, for a portion on the surface of the tantalum-based thin film where the presence of the etching inhibitor was not confirmed (i.e. a portion indicated by symbol spot 2 in FIG. 2). As a result, the detection intensity of Ca (calcium) and O (oxygen) was high at the spot 1 portion while the detection intensity of Ca (calcium) was very small at the spot 2 portion. From this analysis result, it can be presumed that a layer containing calcium as the etching inhibitor is present at the spot 1 portion. Analysis by EDX was carried out in the same manner for other portions, where the convex defect was detected, of the tantalum-based thin film and, as a result, there were found those portions where the detection intensity of magnesium was relatively high. From this result, it can be presumed that a layer containing magnesium as an etching inhibitor is also present. Further, analysis by EDX was carried out in the same manner for other portions, where the convex defect was detected, of the tantalum-based thin film and, as a result, there were also found those portions where the detection intensity of aluminum was relatively high. From this result, it can be presumed that a layer containing aluminum as an etching inhibitor is also present.

Also with respect to the chromium-based mask blank, thin films made of a chromium-based material were laminated in the same manner and then a defect inspection was carried out using the mask blank defect inspection apparatus. Cross-sectional observation by STEM and element analysis by EDX were carried out in the same manner for a detected convex defect, but no layer like that described with reference to FIG. 2 was found.

From the TOF-SIMS and STEM results described above, it has been made clear that the reason for the occurrence of the large difference between the numbers of micro black defects on the transfer masks manufactured from the tantalum-based mask blank and the chromium-based mask blank is due to the difference between the numbers of portions, where the etching inhibitor is adhering, of those mask blanks.

From the results of the mask blank defect inspection using the two-kinds of binary mask blanks and the analysis results described above, it is considered that the micro black defect of the mask occurred in the following manner. Hereinbelow, consideration will be given with reference to FIGS. 3A to 3E.

Herein, it is assumed that a mask is manufactured using a mask blank in which a TaN light-shielding film 11 and a TaO antireflection layer 12 are laminated on a synthetic quartz glass substrate 10.

Figure 3A:
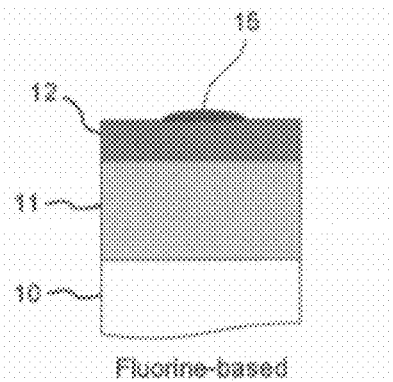
FIGS. 3A to 3E are diagrams for explaining the mechanism of the occurrence of a micro black defect.

(1) By surface treatment of the mask blank, calcium contained in a treatment liquid (surfactant) firmly adheres to a mask blank surface (FIG. 3A). Since the adhering calcium (etching inhibitor) is extremely thin, it cannot be detected even by the newest mask blank defect inspection apparatus.

(2) When a resist pattern is formed on the mask blank surface, the calcium remains on the mask blank (antireflection layer 12) surface where the resist pattern is not formed. In the case where the antireflection layer 12 is patterned by dry etching using a fluorine-based gas, the calcium and calcium fluoride produced due to the dry etching have high boiling points and thus are not etched, thereby forming an etching inhibitor 15.

Figure 3B:
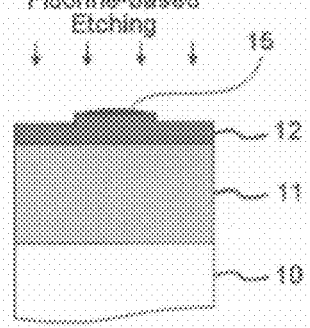
Figure 3C:
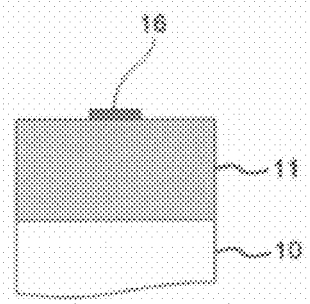

(3) Using the resist pattern as a mask, the antireflection layer 12 is patterned by dry etching using the fluorine-based gas. In this event, a region where the etching inhibitor 15 is adhering serves as a mask so that an extremely thin remaining portion 16 of the TaO antireflection layer 12 is formed in this region (FIGS. 3B and 3C).

Figure 3D:
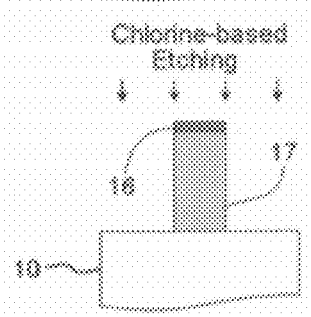

(4) Then, the light-shielding layer 11 is patterned by dry etching using a chlorine-based gas. In this event, the extremely thin antireflection layer remaining portion 16 serves as a mask so that a micro black defect core 17 is formed under this remaining portion 16 (FIG. 3D).

Figure 3E:
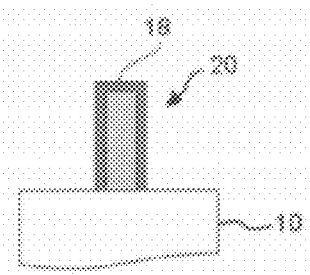

(5) Thereafter, through removal of the resist pattern, cleaning, and so on, a surface of the core 17 is oxidized to thereby form an oxide layer 18 around the core 17 so that a micro black defect 20 is formed (FIG. 3E).

One of reasons why micro black defects hardly occurred on the chromium-based mask is considered to be that, from the measurement result of the zeta potential of the mask blank surfaces of the chromium-based mask blank and the tantalum-based mask blank, the zeta potential of the tantalum-based mask blank is greater by several tens of mV than that of the chromium-based mask blank in a neutral to weak alkaline region. Further, as another reason, since the chromium-based mask was manufactured by radical-based dry etching, it is considered that the antireflection layer and the light-shielding layer disappeared due to the isotropic etching action and thus micro black defects also disappeared along with the disappearance of the antireflection layer and the light-shielding layer in the mask manufacturing processes.

Even in the case where a single-layer tantalum-based thin film is etched by ion-based dry etching, a micro black defect occurs. In this case, it is considered that an etching inhibitor firmly adheres to a surface of the tantalum-based thin film and that a region where the etching inhibitor is adhering serves as a mask so as to remain until completion of the etching or just before the etching completion so that an extremely thin remaining portion of the tantalum-based thin film is formed in this region.

While the mechanism of the occurrence of the micro black defect has been described in the case of calcium, it is considered that, in terms of the principle of etching with a dry etching gas, the same mechanism applies to later-described magnesium, iron, copper, manganese, aluminum, and compounds thereof, which serve as etching inhibitors, because they each have a very high boiling point.

A mask blank surface treatment method according to an embodiment of this invention is as follows:

A mask blank surface treatment method for surface-treating, using a treatment liquid, a surface of a mask blank having on a substrate a thin film which is to be formed into a transfer pattern and is made of a material that can be etched by ion-based dry etching, wherein the concentration of an etching inhibitor contained in the treatment liquid is set to 0.3 ppb or less.

Herein, "a material that can be etched by ion-based dry etching" is a material that can be dry-etched using a fluorine-based gas or a chlorine-based gas substantially free of oxygen. Specifically, there can be cited tantalum (Ta), tungsten (W), zirconium (Zr), hafnium (Hf), vanadium (V), niobium (Nb), nickel (Ni), titanium (Ti), palladium (Pd), molybdenum (Mo), silicon (Si), and compounds thereof. In terms of controlling the optical properties and the etching characteristics, the material may contain oxygen, nitrogen, carbon, hydrogen, boron, or fluorine.

In terms of the processing performance, the material of the thin film preferably contains tantalum. The thin film is particularly preferably a laminated film in which a tantalum nitride film containing tantalum and nitrogen and a tantalum oxide film containing tantalum and oxygen are laminated together. Herein, the tantalum nitride film is required to contain at least tantalum and nitrogen and thus may contain another/other element/elements in addition to tantalum and nitrogen. Likewise, the tantalum oxide film may contain another/other element/elements in addition to tantalum and oxygen.

As the fluorine-based gas, there can be cited $CHF_3$, $CF_4$, $SF_6$, $C_2F_6$, $C_4F_8$, and so on. As the chlorine-based gas, there can be cited $Cl_2$, $SiCl_4$, $CHCl_3$, $CH_2Cl_2$, $CCl_4$, and so on. Alternatively, a mixed gas of such a fluorine-based gas or such a chlorine-based gas and a gas such as He, $H_2$, Ar, or $C_2H_4$ can be used as a dry etching gas.

In a transmission type mask blank, "a thin film which is to be formed into a transfer pattern" may be a light-shielding film having a function of shielding exposure light, an antireflection film having a function of suppressing the surface reflection of exposure light in order to suppress multireflection, a phase shift film having a function of producing a predetermined phase difference for exposure light in order to enhance the pattern resolution, or the like and may alternatively be a laminated film in which these films are laminated. In a reflective type mask blank, "a thin film which is to be formed into a transfer pattern" may be an absorber film having a function of absorbing exposure light, a reflection reducing film that reduces the reflection of the exposure light for improving the reflectance contrast between an absorber film pattern, formed in the absorber film, and a multilayer reflective film for the exposure light or defect inspection light, a buffer layer for preventing etching damage to the multilayer reflective film in patterning the absorber film into the absorber film pattern, or the like.

As a film forming the mask blank, an etching mask film (hard mask film) that serves as an etching mask (hard mask) in etching an underlying material film may be provided in addition to the above-mentioned thin film to be formed into the transfer pattern. Alternatively, the thin film to be formed into the transfer pattern may be in the form of a laminated film and an etching mask film (hard mask film) may be provided as part of the laminated film. In this invention, the most significant effect can be obtained in the case of the mask blank in which the etching mask film (hard mask film) is formed as the film forming the mask blank.

In the case of the transmission type mask blank, the material of the substrate is required to be a material that can transmit exposure light and, for example, a synthetic quartz glass can be cited. On the other hand, in the case of the reflective type mask blank, the material of the substrate is required to be a material that can prevent thermal expansion due to absorption of exposure light and, for example, a TiO$_2$—SiO$_2$ low-expansion glass can be cited. In the reflective type mask blank, the substrate is a multilayer reflective film coated substrate in which a multilayer reflective film (Mo/Si multilayer reflective film) for reflecting exposure light is formed on the substrate.

As the treatment liquid, there can be cited a cleaning liquid which is used for removing foreign matter (particles) adhering to the mask blank and foreign matter (particles) incorporated in the thin film to be formed into the transfer pattern, a surface treatment liquid (e.g. hexamethyldisilazane (HMDS)) for reducing the surface energy of the mask blank surface in order to prevent the occurrence of stripping or collapse of a fine pattern, and other organic silicon-based surface treatment liquids each for alkyl-silylating the mask blank surface.

The surface treatment method may be of either a spin type that carries out surface treatment while supplying the treatment liquid on the rotating substrate, or a dip type that carries out surface treatment by dipping the substrate in a treatment bath filled with the treatment liquid.

The etching inhibitor to be paid attention to in this invention is an organic or inorganic material having a resistance to a dry etching gas. Specifically, as the etching inhibitor, it is good to pay attention to a material containing at least one selected from calcium (Ca), magnesium (Mg), iron (Fe), copper (Cu), manganese (Mn), aluminum (Al), and compounds thereof. More specifically, it is good to pay attention to Mg which is relatively easily dissolved in an alkaline solution of pH11 or less for use as a treatment liquid (cleaning liquid), and to Ca which is relatively easily dissolved in an alkaline solution of pH12 or less for use as a treatment liquid (cleaning liquid). It is also good to pay attention to Al which is relatively easily dissolved in an alkaline solution of pH8 or more and in an acid solution of pH4 or less each for use as a treatment liquid (cleaning liquid).

When the etching inhibitor is Mg or Ca, since a dry etching gas in the form of a fluorine-based gas or a chlorine-based gas is used, a compound of calcium fluoride (boiling point: 2500° C.), magnesium fluoride (boiling point: 1260° C.), calcium chloride (boiling point: 1600° C.), or magnesium chloride (boiling point: 1412° C.) is produced in dry etching and serves as an etching inhibitor. Boiling points of typical chlorides and fluoride of the etching inhibitors listed above are iron chloride (boiling point: 1023° C. (FeCl$_2$)), copper chloride (boiling point: 1366° C. (CuCl)), manganese chloride (boiling point: 1190° C. (MnCl$_2$)), and aluminum fluoride (boiling point: 1260° C. (AlF$_3$)). Other than these fluorides and chlorides, Ca, Mg, Fe, Cu, Mn, Al, and compounds thereof each having a boiling point of about 300° C. or more serve as etching inhibitors.

The concentration of the etching inhibitor contained in the treatment liquid is set to 0.3 ppb or less. If the etching inhibitor concentration exceeds 0.3 ppb, the number of micro black defects with a size of 20 to 100 nm present in a manufactured mask exceeds as many as 50 so that defect correction becomes practically difficult, thus leading to a problem.

The concentration of the etching inhibitor contained in the treatment liquid is preferably 0.1 ppb or less, more preferably 0.05 ppb or less, still more preferably 0.01 ppb or less, and further preferably 0.001 ppb or less.

The concentration of the etching inhibitor contained in the treatment liquid can be measured by inductively coupled plasma-mass spectroscopy (ICP-MS) for the treatment liquid immediately before being supplied to the mask blank surface and represents the total concentration of elements (excluding those below the detection limit) detected by ICP-MS.

Figure 4B:
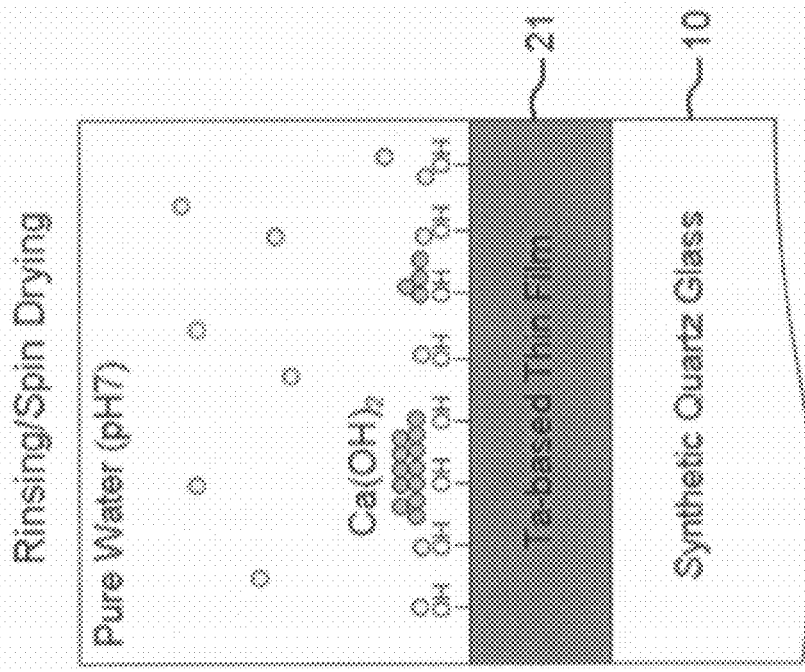
FIGS. 4A and 4B are diagrams for explaining the mechanism that an etching inhibitor adheres to a surface of a tantalum-based mask blank.
Figure 4A:
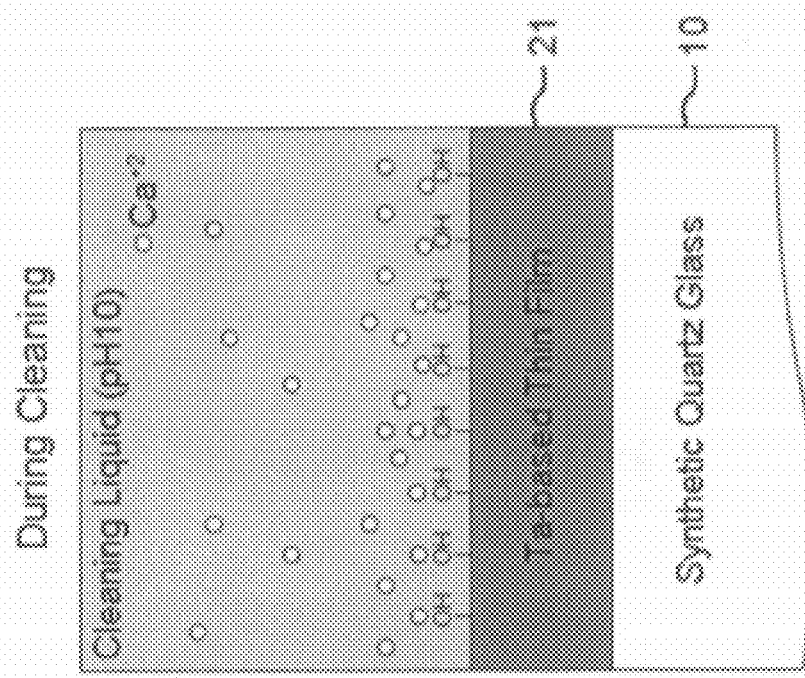
Figure 5B:
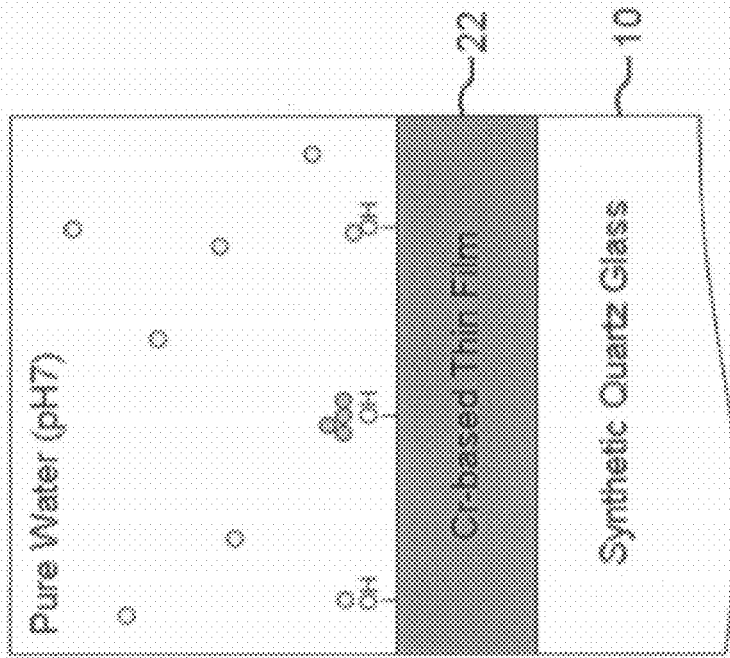
FIGS. 5A and 5B are diagrams for explaining the mechanism that an etching inhibitor does not easily adhere to a surface of a chromium-based mask blank.
Figure 5A:
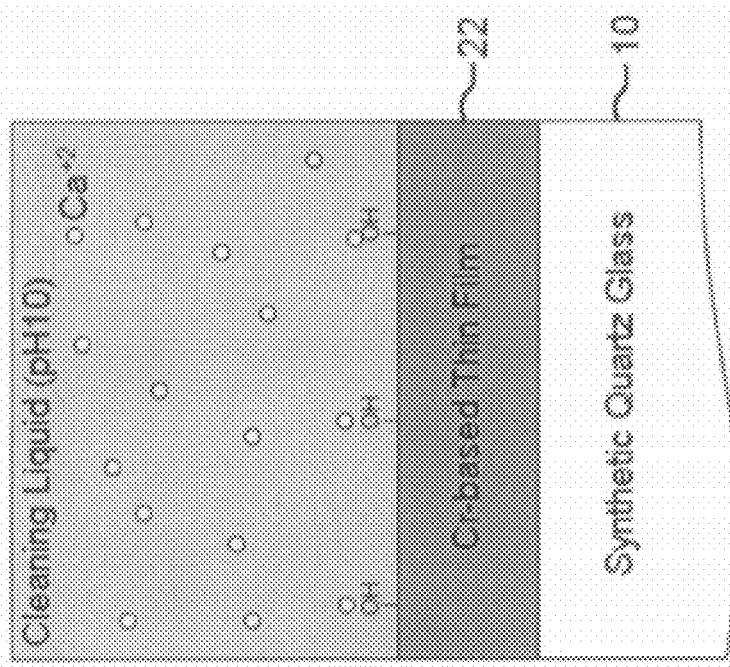

As described above, after the surface treatment using the alkaline cleaning liquid containing the surfactant, calcium and so onus etching inhibitors were detected on the surface of the thin film of the tantalum-based mask blank. On the other hand, calcium or the like was hardly detected on the surface of the thin film of the chromium-based mask blank. Hereinbelow, the cause of the occurrence of such a difference will be considered with reference to FIGS. 4A, 4B, 5A and 5B. In order to facilitate understanding of a description, FIGS. 4A and 4B show a tantalum-based mask blank comprising a synthetic quartz glass substrate 10 and a Ta-based thin film 21 formed thereon while FIGS. 5A and 5B show a chromium-based mask blank comprising a synthetic quartz glass substrate 10 and a Cr-based thin film 22 formed thereon. The following consideration is based on a presumption by the present inventors at the time of filing this application and by no means limits the scope of this invention.

In FIGS. 4A and 4B, many hydroxyl groups (OH groups) are present on a surface of the thin film 21 of the tantalum-based mask blank. Calcium ions (Ca$^{2+}$) contained in a cleaning liquid are attracted to these hydroxyl groups (FIG. 4A). Then, upon rinsing with pure water for washing away the cleaning liquid after cleaning with the cleaning liquid, the liquid covering the surface of the thin film 21 rapidly changes from alkaline (pH10) to neutral (around pH7). As a result, the calcium ions attracted to the surface of the thin film 21 tend to be precipitated as calcium hydroxide (Ca(OH)$_2$) on the film surface (FIG. 4B). It is considered that this calcium hydroxide served as the etching inhibitor on the surface of the thin film of the tantalum-based mask blank.

On the other hand, as shown in FIGS. 5A and 5B, only a few hydroxyl groups (OH groups) are present on a surface of the thin film 22 of the chromium-based mask blank. Accordingly, calcium ions contained in a cleaning liquid are not so attracted to the surface of the thin film 22. Since the calcium concentration itself in impurities contained in the cleaning liquid is low, the concentration of calcium ions in the vicinity of the film surface is extremely low (FIG. 5A). As a result, upon rinsing with pure water for washing away the cleaning liquid after cleaning with the cleaning liquid, the calcium ions attracted to the film surface are washed away from the film surface before becoming calcium hydroxide or, even if the calcium ions attracted to the film surface become calcium hydroxide, only a few molecules, that do not inhibit etching, are precipitated on the film surface (FIG. 5B).

While the description has been given above of the mechanism that the etching inhibitor containing calcium such as calcium hydroxide tends to adhere to the surface of the thin film of the tantalum-based mask blank, the same mechanism can also be applied to an etching inhibitor containing magnesium such as magnesium hydroxide (Mg(OH)$_2$).

The concentration of the etching inhibitor contained in the treatment liquid for use in the mask blank surface treatment method and the mask blank manufacturing method according to this invention can be set likewise based on the evaluation result of a new evaluation technique that can detect a latent defect of a mask blank which comprises an etching inhibitor and causes a micro black defect of a mask.

Specifically, the concentration of an etching inhibitor contained in a treatment liquid can be set to a value at which the number of convex portions that remain on a substrate surface after removing, by etching with a dry etching gas which enables ion-based dry etching, a thin film, which is to be formed into a transfer pattern, of a mask blank having been subjected to surface treatment using the treatment liquid becomes a predetermined value or less in a transfer pattern forming region.

The dry etching of the thin film is preferably carried out under the same conditions as in the mask manufacturing processes. The same conditions are not necessarily required as long as ion-based dry etching is enabled.

The substrate surface after the thin film is etched may be in a state where the substrate surface is exposed by entirely removing the thin film (while the above-mentioned convex portions such as micro black defects are remaining) by etching under normal conditions (including overetching) for patterning the thin film, or in a state where the thin film still remains on the substrate surface at an etching intermediate stage. In terms of the detection sensitivity for a latent mask blank defect, the former state, i.e. the state where the substrate surface is exposed by entirely removing the thin film by etching, is preferable. In the case where the thin film is a laminated film of two or more layers and each layer is made of a material having etching selectivity, it is preferable that at least the uppermost layer be removed by pattern etching and, after etching the lower layer adjacent to the uppermost layer using a pattern of the uppermost layer as a mask, surface shape information be obtained.

The above-mentioned transfer pattern forming region is preferably, in an actual mask, a 132 mm×132 mm region including a region where a thin film pattern as a transfer pattern is formed (132 mm×104 mm region including the center of a main surface of a mask blank), or a larger region (e.g. 142 mm×142 mm region).

In order to set the number of defects of a mask to 50 or less in consideration of the load of mask defect correction, the number of convex portions can be selected taking into account the pattern occupation ratio of a space or void pattern (white pattern) in a transfer pattern to be formed in the mask. Herein, the pattern occupation ratio is an area ratio of the total area of a white pattern, where a thin film is removed, in a transfer pattern forming region to the total area of the transfer pattern forming region. For example, when a resist to be formed on a mask blank is a positive resist, it is possible to set the pattern occupation ratio of the white pattern to 25% and to set the number of convex portions to 200 or less. The number of convex portions is preferably set to 100 or less, more preferably 50 or less, and further preferably 25 or less. In the case of a negative resist, since the exposed surface area of a substrate becomes greater, the number of convex portions can be set to 50 or less equal to the allowable number of mask defects and is preferably set to 25 or less.

In this invention, as means for suppressing the occurrence of a latent defect of a mask blank which is not detected in a defect inspection of the mask blank, but causes the occurrence of a micro black defect of a mask, it is also possible to apply treatment liquid selection methods, mask blank manufacturing methods, and so on having the structures shown below. The concentration of the etching inhibitor in the treatment liquid applied to the above-mentioned mask blank surface treatment method and so on can be selected by the treatment liquid selection method with the following structure.

(Structure 1A)

A treatment liquid selection method comprising:

a step of preparing a plurality of mask blanks each having on a substrate a thin film which is to be formed into a transfer pattern and is made of a material that can be etched by ion-based dry etching;

a step of preparing a plurality of kinds of treatment liquids having different concentrations of an etching inhibitor that serves to inhibit etching in manufacturing a mask using each of the mask blanks;

a step of surface-treating the thin films using the treatment liquids; respectively;

a step of forming a resist pattern on each of the surface-treated thin films, etching each of the thin films with a dry etching gas, which enables the ion-based dry etching, using the resist pattern as a mask, to thereby form a thin film pattern to manufacture a mask, and obtaining defect information of a surface of each of the masks;

a step of producing a correlation between the concentrations of the etching inhibitor in the treatment liquids and the defect information of the surfaces of the masks, selecting the defect information, that satisfies a desired specification or quality, from the produced correlation, and specifying the concentration of the etching inhibitor corresponding to the selected defect information; and a step of selecting the treatment liquid having the specified concentration as a treatment liquid for use in surface treatment of a mask blank.

(Structure 2A)

The treatment liquid selection method according to Structure 1A, wherein the etching inhibitor is an organic or inorganic material having a resistance to a dry etching gas.

(Structure 3A)

The treatment liquid selection method according to Structure 1A or 2A, wherein the etching inhibitor is a material containing at least one selected from calcium, magnesium, iron, copper, manganese, aluminum, and compounds thereof.

(Structure 4A)

The treatment liquid selection method according to any one of Structures 1A to 3A, wherein the etching inhibitor is a material containing at least one selected from calcium, magnesium, aluminum, and compounds thereof.

(Structure 5A)

The treatment liquid selection method according to any one of Structures 1A to 4A, wherein the dry etching gas is a fluorine-based gas or a chlorine-based gas substantially free of oxygen.

(Structure 6A)

The treatment liquid selection method according to any one of Structures 1A to 5A, wherein the material of the thin film contains tantalum.

(Structure 7A)

The treatment liquid selection method according to any one of Structures 1A to 6A, wherein the thin film is a laminated film in which a tantalum nitride film containing tantalum and nitrogen and a tantalum oxide film containing tantalum and oxygen are laminated together.

(Structure 8A)

The treatment liquid selection method according to any one of Structures 1A to 7A, wherein the treatment liquid is a cleaning liquid.

(Structure 9A)

A mask blank manufacturing method comprising a surface treatment step of selecting the treatment liquid using the treatment liquid selection method according to any one of Structures 1A to 8A and surface-treating a mask blank, which is different from the surface-treated mask blank, using the selected treatment liquid.

(Structure 10A)

The mask blank manufacturing method according to Structure 9A, wherein the treatment liquid is a cleaning liquid.

(Structure 11A)

A mask manufacturing method that manufactures a mask by patterning the thin film of the mask blank manufactured by the mask blank manufacturing method according to Structure 9A or 10A.

By applying each of the above-mentioned structures, it is possible to suppress the occurrence of a latent defect of a mask blank which is not detected in a defect inspection of the mask blank, but causes the occurrence of a micro black defect of a mask. Further, it is possible to reduce the load of mask defect correction and to suppress the occurrence of a micro black defect whose correction is impossible.

The above-mentioned treatment liquid selection method comprises the following Steps 1 to 6. Hereinbelow, those matters that will not be particularly referred to are the same as those described in the above-mentioned mask blank surface treatment method and mask blank manufacturing method.

(Step 1)

There are prepared a plurality of mask blanks (evaluation mask blanks) each having on a substrate a thin film which is to be formed into a transfer pattern and is made of a material that can be etched by ion-based dry etching [Evaluation Mask Blank Preparation Step].

The evaluation mask blank is the same as the mask blank, having the thin film to be formed into the transfer pattern, which has been described in the above-mentioned mask blank surface treatment method.

(Step 2)

There are prepared a plurality of kinds of treatment liquids having different concentrations of an etching inhibitor that serves to inhibit etching in manufacturing a mask using each of the mask blanks [Evaluation Treatment Liquid Preparation Step].

(Step 3)

With respect to the plurality of mask blanks (evaluation mask blanks) prepared in Step 1, surfaces of the thin films of the mask blanks are respectively surface-treated using the treatment liquids prepared in Step 2 [Evaluation Mask Blank Surface Treatment Step].

(Step 4)

A resist pattern is formed on each of the surface-treated thin films of the mask blanks (evaluation mask blanks), then each of the thin films is etched with a dry etching gas, which enables the ion-based dry etching, using the resist pattern as a mask, to thereby form a thin film pattern to manufacture a mask, and then defect information of a surface of each of the manufactured masks is obtained [Mask Defect Information Obtaining Step].

The mask referred to herein does not necessarily have the same transfer pattern as that of a mask which is actually manufactured. The mask defect information preferably includes at least black defect information. The black defect information includes the number of defects, sizes thereof, and so on. Preferably, the mask defect information is obtained by measuring a 132 mm×132 mm region including a region where a thin film pattern as a transfer pattern is formed (132 mm×104 mm region), or a larger region.

(Step 5)

There is produced a correlation between the concentrations of the etching inhibitor in the treatment liquids prepared in Step 2 and the defect information of the masks obtained in Step 4, then the defect information, that satisfies a desired mask specification or quality, is selected from the produced correlation, and then the concentration of the etching inhibitor in the treatment liquid corresponding to the selected defect information is specified [Etching Inhibitor Concentration Specifying Step].

The correlation is produced such that the numbers of black defects in the masks are mapped to the concentrations of the etching inhibitor in the treatment liquids. Preferably, the correlation is produced such that the numbers of black defects per size in the masks are mapped to the concentrations of the etching inhibitor in the treatment liquids.

The desired mask specification or quality represents, for example, the defect size in order to satisfy a mask specification required per semiconductor design rule, but is not limited thereto. The desired mask specification or quality may be a mask defect specification/quality which is necessary for satisfying CD (Critical Dimension) uniformity and linearity after black defect correction. Further, the desired mask specification or quality may be determined in consideration of the process load for black defect correction. Specifically, as the desired mask specification or quality, it is possible to set the number of black defects to 50 or less in a 132 mm×132 mm region including a region where a transfer pattern is formed, taking into account the load of defect correction. Preferably, the number of black defects in the mask is set to 25 or less (Step 6)

Finally, the treatment liquid having the concentration of the etching inhibitor specified in Step 5 is selected as a treatment liquid for use in surface treatment of a mask blank [Treatment Liquid Selection Step].

The mask blank manufacturing method according to the embodiment of this invention further comprises the following Step 7 in addition to the above-mentioned Steps 1 to 6.

(Step 7)

There is prepared a mask blank which is different from the evaluation mask blanks in Steps 1 and 3 and then a surface of this mask blank is surface-treated using the treatment liquid, with the specified concentration of the etching inhibitor, selected in Step 6 [Mask Blank Surface Treatment Step].

The mask manufacturing method according to the embodiment of this invention further comprises the following Step 8 in addition to the above-mentioned Steps 1 to 7.

(Step 8)

Using the mask blank surface-treated in Step 7, a thin film of the mask blank is patterned to thereby manufacture a mask.

On the other hand, the present inventors have found that a new evaluation technique which obtains surface shape information {specifically, information of convex portions (number of convex portions and sizes thereof) remaining on a surface} after a thin film, to be formed into a transfer pattern, formed on a substrate is removed by etching with an etchant (etching gas that enables ion-based dry etching) can be applied to a selection method of a treatment liquid that can suppress the occurrence of a latent defect of a mask blank which is not detected in a defect inspection of the mask blank, but causes the occurrence of a micro black defect of a mask. Then, using this new evaluation technique, the present inventors have derived treatment liquid selection methods, mask blank manufacturing methods, and so on having the structures shown below.

(Structure 1B)

A treatment liquid selection method comprising:

a step of preparing a plurality of mask blanks each having on a substrate a thin film which is to be formed into a transfer pattern and is made of a material that can be etched by ion-based dry etching;

a step of preparing a plurality of kinds of treatment liquids having different concentrations of an etching inhibitor that serves to inhibit etching in manufacturing a mask using each of the mask blanks;

a step of surface-treating the thin films using the treatment liquids, respectively;

a step of removing each of the surface-treated thin films by etching with a dry etching gas that enables the ion-based dry etching, and then obtaining surface shape information of a surface of each of the substrates after the etching;

a step of producing a correlation between the concentrations of the etching inhibitor in the treatment liquids and the surface shape information of the surfaces of the substrates while using the surface shape information of the surfaces of the substrates as latent mask blank defect information about a latent mask blank defect that causes a mask defect, then selecting the surface shape information, that satisfies a desired specification or quality, from the produced correlation, and then specifying the concentration of the etching inhibitor corresponding to the selected surface shape information; and a step of selecting the treatment liquid having the specified concentration as a treatment liquid for use in surface treatment of a mask blank.

(Structure 2B)

The treatment liquid selection method according to Structure 1B, wherein the selection of the surface shape information is carried out by manufacturing masks using mask blanks which are different from the mask blanks used for obtaining the surface shape information and which are respectively surface-treated using the treatment liquids, then producing a correlation between defect information of the masks and the surface shape information of the surfaces of the substrates, and then selecting the surface shape information, corresponding to the mask defect information that satisfies a desired specification or quality, from the produced correlation.

(Structure 3B)

The treatment liquid selection method according to Structure 1B or 2B, wherein the etching inhibitor is an organic or inorganic material having a resistance to a dry etching gas.

(Structure 4B)

The treatment liquid selection method according to any one of Structures 1B to 3B, wherein the etching inhibitor is a material containing at least one selected from calcium, magnesium, iron, copper, manganese, aluminum, and compounds thereof.

(Structure 5B)

The treatment liquid selection method according to any one of Structures 1B to 4B, wherein the etching inhibitor is a material containing at least one selected from calcium, magnesium, aluminum, and compounds thereof.

(Structure 6B)

The treatment liquid selection method according to any one of Structures 1B to 5B, wherein the dry etching gas is a fluorine-based gas or a chlorine-based gas substantially free of oxygen.

(Structure 7B)

The treatment liquid selection method according to any one of Structures 1B to 6B, wherein the material of the thin film contains tantalum.

(Structure 8B)

The treatment liquid selection method according to any one of Structures 1B to 7B, wherein the thin film is a laminated film in which a tantalum nitride film containing tantalum and nitrogen and a tantalum oxide film containing tantalum and oxygen are laminated together.

(Structure 9B)

The treatment liquid selection method according to any one of Structures 1B to 8B, wherein the treatment liquid is a cleaning liquid.

(Structure 10B)

A mask blank manufacturing method comprising a surface treatment step of selecting the treatment liquid using the treatment liquid selection method according to any one of Structures 1B to 9B and surface-treating a mask blank, which is different from the surface-treated mask blank, using the selected treatment liquid.

(Structure 11B)

The mask blank manufacturing method according to Structure 10B, wherein the selection of the surface shape information is carried out by manufacturing masks using mask blanks which are different from the mask blanks used for obtaining the surface shape information and which are respectively surface-treated using the treatment liquids, then producing a correlation between defect information of the masks and the surface shape information of the surfaces of the substrates, and then selecting the surface shape information, corresponding to the mask defect information that satisfies a desired specification or quality, from the produced correlation.

(Structure 12B)

A mask manufacturing method that manufactures a mask by patterning the thin film of the mask blank manufactured by the mask blank manufacturing method according to Structure 10B or 11B.

By applying each of the above-mentioned structures, it is possible to suppress the occurrence of a latent defect of a mask blank which is not detected in a defect inspection of the mask blank, but causes the occurrence of a micro black defect of a mask. Further, it is possible to reduce the load of mask defect correction and to suppress the occurrence of a micro black defect whose correction is impossible.

As the surface shape information of the substrate surface after the thin film is etched in each of the above-mentioned structures, when a mask black defect is a target, at least convex shape information is obtained. As the convex shape information, the shape, size, number, density, and so on are cited. The surface shape information of the substrate surface after the thin film is etched may be surface shape information in a state where the substrate surface is exposed by entirely removing the thin film (while the thin film and so on remain in convex shape at convex portions) by etching under normal conditions (including overetching) for patterning the thin film, or in a state where the thin film still remains on the substrate surface at an etching intermediate stage. In terms of the detection sensitivity for a latent mask blank defect, the surface shape information in the former state, i.e. the state where the substrate surface is exposed by entirely removing the thin film by etching, is preferable. In the case where the thin film is a laminated film of two or more layers and each layer is made of a material having etching selectivity, it is preferable that at least the uppermost layer be removed by pattern etching and, after etching the lower layer adjacent to the uppermost layer using a pattern of the uppermost layer as a mask, surface shape information be obtained.

The above-mentioned treatment liquid selection method comprises the following Steps 1 to 6. Hereinbelow, those matters that will not be particularly referred to are the same as those described in the above-mentioned mask blank surface treatment method and mask blank manufacturing method.

(Step 1)

There are prepared a plurality of mask blanks (evaluation mask blanks) each having on a substrate a thin film which is to be formed into a transfer pattern and is made of a material that can be etched by ion-based dry etching [Evaluation Mask Blank Preparation Step].

(Step 2)

There are prepared a plurality of kinds of treatment liquids having different concentrations of an etching inhibitor that serves to inhibit etching in manufacturing a mask using each of the mask blanks [Evaluation Treatment Liquid Preparation Step].

(Step 3)

With respect to the plurality of mask blanks (evaluation mask blanks) prepared in Step 1, surfaces of the thin films of the mask blanks are respectively surface-treated using the treatment liquids prepared in Step 2 [Evaluation Mask Blank Surface Treatment Step].

(Step 4')

Each of the surface-treated thin films is removed by etching with a dry etching gas that enables the ion-based dry etching, and then surface shape information of a surface of each of the substrates after the etching is obtained [Substrate-Surface Surface Shape Information Obtaining Step].

In this Step 4', the entire surface of the thin film of the mask blank is dry-etched without providing a resist pattern on the thin film. In this event, a region where a layer of the etching inhibitor is present on the thin film inhibits the dry etching of the thin film just under it and therefore part of the thin film remains as a convex portion (convex shape) on the substrate in that region.

(Step 5)

While using the surface shape information of the surfaces of the substrates, obtained in Step 4', as latent mask blank defect information about a latent mask blank defect that causes a mask defect, a correlation between the concentrations of the etching inhibitor in the treatment liquids prepared in Step 2 and the surface shape information of the surfaces of the substrates obtained in Step 4' is produced, then the surface shape information that satisfies a desired specification or quality is selected from the produced correlation, and then the concentration of the etching inhibitor corresponding to the selected surface shape information is specified [Etching Inhibitor Concentration Specifying Step].

Herein, the correlation is produced such that at least convex shape information in the surface shape information of the surfaces of the substrates is mapped to the concentrations of the etching inhibitor in the treatment liquids. It is preferable that numerical value information of the shape, size, and number or density, as the convex shape information, be mapped to the concentrations of the etching inhibitor in the treatment liquids.

In order to satisfy a mask specification required per semiconductor design rule, the surface shape information that satisfies the desired specification or quality can be properly set taking into account, for example, a mask defect specification/quality which is necessary for satisfying the CD uniformity and linearity after defect size correction or mask defect correction, and the process load for black defect correction.

Specifically, in order to set the number of defects of a mask to 50 or less in consideration of the load of mask defect correction, the number of convex portions can be selected taking into account the pattern occupation ratio of a space or void pattern (white pattern) in a transfer pattern to be formed in the mask. For example, when a resist to be formed on a mask blank is a positive resist, it is possible to set the pattern occupation ratio of the white pattern to 25% and to set the number of convex portions in the surface shape information to 200 or less. The number of convex portions is preferably set to 100 or less, more preferably 50 or less, and further preferably 25 or less. In the case of a negative resist, since the exposed surface area of a substrate becomes greater, the number of convex portions in the surface shape information can be set to 50 or less equal to the allowable number of mask defects and is preferably set to 25 or less.

Preferably, masks are manufactured by forming a resist film on a surface of a thin film of each of mask blanks which are different from the evaluation mask blanks in Steps 1 and 3 used for obtaining the surface shape information in Step 4' and which are respectively surface-treated using the treatment liquids prepared in Step 2, then exposing and developing the resist film to form a resist pattern, and then using the resist pattern as a mask to etch the thin film with a dry etching gas that enables ion-based dry etching, thereby forming a thin film pattern, then defect information of the manufactured masks is obtained, then a correlation between the defect information of the masks and the surface shape information of the surfaces of the substrates is produced, and then the surface shape information corresponding to the mask defect information that satisfies a desired specification or quality is selected from the produced correlation. Matters relating to this mask are the same as those described above.

(Step 6)

Finally, the treatment liquid having the concentration of the etching inhibitor specified in Step 5 is selected as a treatment liquid for use in surface treatment of a mask blank [Treatment Liquid Selection Step].

The mask blank manufacturing method according to the embodiment of this invention further comprises the following Step 7 in addition to the above-mentioned Steps 1 to 6.

(Step 7)

There is prepared a mask blank which is different from the evaluation mask blanks in Steps 1 and 3 and then a thin film of this mask blank is surface-treated using the treatment liquid selected in Step 6 [Mask Blank Surface Treatment Step].

The mask manufacturing method according to the embodiment of this invention further comprises the following Step 8 in addition to the above-mentioned Steps 1 to 7.

(Step 8)

Using the mask blank surface-treated in Step 7, the thin film of the mask blank is patterned to thereby manufacture a mask.

Next, mask blank surface treatment methods, mask blank manufacturing methods, and mask manufacturing methods according to this invention will be described with reference to Examples.

Examples 1 to 5 and Comparative Examples 1 and 2

There were prepared a plurality of binary mask blanks for ArF excimer laser exposure adapted to the semiconductor design rule DRAM half-pitch 32 nm node. Each mask blank had, on a synthetic quartz glass substrate with a size of about 152 mm×about 152 mm, a light-shielding film (to be formed into a transfer pattern) having a laminated structure of a TaN light-shielding layer (thickness: 42 nm) substantially composed of tantalum and nitrogen and a TaO antireflection layer (thickness: 9 nm) substantially composed of tantalum and oxygen.

Then, using a plurality of kinds of cleaning liquids A to G having different concentrations of an etching inhibitor, the mask blanks were respectively cleaned. The cleaning of the mask blanks was carried out by spin cleaning. After the cleaning using the cleaning liquid B, C, D, E, F, G, rinsing with the cleaning liquid A was also carried out. The etching inhibitor concentration was measured by inductively coupled plasma-mass spectroscopy (ICP-MS) for the cleaning liquid immediately before being supplied to a surface of the light-shielding film of the mask blank. As a result, only calcium was an element contained above the detection limit.

The plurality of kinds of cleaning liquids used in Examples 1 to 5 and Comparative Examples 1 and 2 were as follows:

cleaning liquid A: DI (deionized) water (calcium concentration: 0.001 ppb) (Example 1)

cleaning liquid B: surfactant B containing alkaline cleaning liquid (calcium concentration: 0.01 ppb) (Example 2)

cleaning liquid C: surfactant C containing alkaline cleaning liquid (calcium concentration: 0.05 ppb) (Example 3)

cleaning liquid D: surfactant D containing alkaline cleaning liquid (calcium concentration: 0.1 ppb) (Example 4)

cleaning liquid E: surfactant E containing alkaline cleaning liquid (calcium concentration: 0.3 ppb) (Example 5)

cleaning liquid F: surfactant F containing alkaline cleaning liquid (calcium concentration: 1 ppb) (Comparative Example 1)

cleaning liquid G: surfactant G containing alkaline cleaning liquid (calcium concentration: 3 ppb) (Comparative Example 2)

Then, with respect to each of the mask blanks cleaned with the above-mentioned cleaning liquids, dry etching using a fluorine-based ($CF_4$) gas was carried out to remove the antireflection layer and then dry etching using a chlorine-based ($Cl_2$) gas was carried out to remove the light-shielding layer.

Then, with respect to a surface of each of the substrates after the etching, the number of convex portions such as micro black defects was measured using a mask blank defect inspection apparatus (M1350: manufactured by Lasertec Corporation). As a result of examining the number of convex portions present on the substrate (measurement region: 132 mm×132 mm), it was 13 in the case of the cleaning liquid A (Example 1), 28 in the case of the cleaning liquid B (Example 2), 56 in the case of the cleaning liquid C (Example 3), 85 in the case of the cleaning liquid D (Example 4), 122 in the case of the cleaning liquid E (Example 5), 823 in the case of the cleaning liquid F (Comparative Example 1), and 1768 in the case of the cleaning liquid G (Comparative Example 2). That is, the result was such that as the calcium concentration in the cleaning liquid became lower, the number of convex portions also became smaller.

Then, there were prepared mask blanks which were different from the above-mentioned mask blanks, but had the same film structure as described above. Then, the mask blanks were respectively cleaned using the cleaning liquids A to G in the same manner as described above. After the cleaning, the mask blanks were subjected to a defect inspection using the mask blank defect inspection apparatus (M1350: manufactured by Lasertec Corporation). As a result of the defect inspection, no defects such as particles or pinholes having a size of 60 nm or more were confirmed on surfaces of the mask blanks.

Then, a chemically amplified positive resist (PRL009: manufactured by FUJIFILM Electronic Materials Co., Ltd.) was spin-coated on a surface of a light-shielding film of each of the cleaned mask blanks and then prebaking was carried out, thereby forming a resist film.

Then, the resist film was subjected to writing, development, and rinsing, thereby forming a resist pattern on the mask blank surface. Then, dry etching using a fluorine-based ($CF_4$) gas was carried out using the resist pattern as a mask, thereby patterning an antireflection layer to form an antireflection layer pattern. Then, dry etching using a chlorine-based ($Cl_2$) gas was carried out using the antireflection layer pattern as a mask, thereby patterning a light-shielding layer to form a light-shielding layer pattern. Finally, the resist pattern was removed, thereby forming a mask.

With respect to the masks thus obtained, a defect inspection was carried out in a transfer pattern forming region (132 mm×104 mm) using a mask defect inspection apparatus (manufactured by KLA-Tencor Corporation). As a result, the number of black defects having a size of 100 nm or less was 3 (cleaning liquid A: Example 1), 7 (cleaning liquid B: Example 2), 9 (cleaning liquid C: Example 3), 21 (cleaning liquid D: Example 4), 28 (cleaning liquid E: Example 5), 106 (cleaning liquid F: Comparative Example 1), and 411 (cleaning liquid G: Comparative Example 2). Accordingly, in each of the masks manufactured using the mask blanks cleaned with the cleaning liquids A to E, the number of defects was 50 or less, leading to small load of mask defect correction. Thus, the excellent result was obtained. On the other hand, in each of the masks manufactured using the mask blanks cleaned with the cleaning liquids F and G, the number of defects was large, leading to large load of mask defect correction, thus making it practically difficult to carry out the defect correction.

From the results described above, it has been confirmed that as the calcium concentration in the cleaning liquid increases, the number of micro black defects of the mask also increases. It has also been seen that, in consideration of the load of mask defect correction, a selection should be made from the cleaning liquids A to E which allow the number of black defects to be 50 or less, as the cleaning liquid of the binary mask blank for ArF excimer laser exposure adapted to the semiconductor design rule DRAM half-pitch 32 nm node.

Examples 6 and 7

Masks were manufactured in the same manner as in Examples 1 and 2 except that use was made of a reflective type mask blank for manufacturing a reflective type mask for use in EUV lithography using extreme ultraviolet (EUV) light (wavelength: about 13 nm).

As a substrate of each reflective type mask blank, use was made of a substrate in which a multilayer reflective film (Mo/Si multilayer reflective film in which Mo and Si are alternately laminated by about 40 cycles) for reflecting EUV light with high reflectance and a protective film (Ru film) serving as an etching stopper in etching an absorber film into a transfer pattern were formed on a $TiO_2$—$SiO_2$ low-expansion glass substrate. On this substrate, an absorber film to be formed into a transfer pattern was formed.

The absorber film had a two-layer structure in which an absorber layer made of a material with high absorptance for EUV light and an antireflection layer made of a material with low reflectance for inspection light were laminated together. As the absorber layer, use was made of TaBN substantially composed of tantalum, boron, and nitrogen, which enables ion-based dry etching, while, as the antireflection layer, use was made of TaBO substantially composed of tantalum, boron, and oxygen, which enables ion-based dry etching.

Then, the reflective type mask blanks were respectively cleaned using the cleaning liquids A and B. After the cleaning, the reflective type mask blanks were subjected to a defect inspection using a mask blank defect inspection apparatus (M1350: manufactured by Lasertec Corporation).

Then, a chemically amplified positive resist (PRL009: manufactured by FUJIFILM Electronic Materials Co., Ltd.) was spin-coated on a surface of the absorber film of each of the cleaned reflective type mask blanks and then prebaking was carried out, thereby forming a resist film.

Then, the resist film was subjected to writing, development, and rinsing, thereby forming a resist pattern on the reflective type mask blank surface. Then, dry etching using a fluorine-based ($CF_4$) gas was carried out using the resist pattern as a mask, thereby patterning the antireflection layer to form an antireflection layer pattern. Then, dry etching using a chlorine-based ($Cl_2$) gas was carried out using the antireflection layer pattern as a mask, thereby patterning the absorber layer to form an absorber layer pattern. Finally, the resist pattern was removed, thereby forming a reflective type mask.

With respect to the reflective type masks thus obtained, a defect inspection was carried out in a transfer pattern forming region (132 mm×104 mm) using a mask defect inspection apparatus (manufactured by KLA-Tencor Corporation). As a result, the number of black defects having a size of 100 nm or less was 5 in the case of the cleaning liquid A (Example 6) and 12 in the case of the cleaning liquid B (Example 7). Accordingly, the number of defects was 50 or less, leading to small load of mask defect correction. Thus, the excellent result was obtained.

Examples 8 to 12 and Comparative Examples 3 and 4

Like in Examples 1 to 5 and Comparative Examples 1 and 2, as the mask blanks for use in the examples, there were prepared a plurality of binary mask blanks for ArF excimer laser exposure adapted to the semiconductor design rule DRAM half-pitch 32 nm node.

Then, using a plurality of kinds of cleaning liquids having different concentrations of an etching inhibitor, the mask blanks were respectively cleaned. The cleaning of the mask blanks was carried out by spin cleaning. After the cleaning using the cleaning liquid B1, C1, D1, E1, F1, G1, rinsing with the cleaning liquid A1 was also carried out. The etching inhibitor concentration was measured by inductively coupled plasma-mass spectroscopy (ICP-MS) for the cleaning liquid immediately before being supplied to a surface of a light-shielding film of the mask blank. As a result, only magnesium was an element contained above the detection limit.

The plurality of kinds of cleaning liquids used in Examples 8 to 12 and Comparative Examples 3 and 4 were as follows:

cleaning liquid A1: DI (deionized) water (magnesium concentration: 0.001 ppb) (Example 8)

cleaning liquid B1: surfactant B1 containing alkaline cleaning liquid (magnesium concentration: 0.01 ppb) (Example 9)

cleaning liquid C1: surfactant C1 containing alkaline cleaning liquid (magnesium concentration: 0.05 ppb) (Example 10)

cleaning liquid D1: surfactant D1 containing alkaline cleaning liquid (magnesium concentration: 0.1 ppb) (Example 11)

cleaning liquid E1: surfactant E1 containing alkaline cleaning liquid (magnesium concentration: 0.3 ppb) (Example 12)

cleaning liquid F1: surfactant F1 containing alkaline cleaning liquid (magnesium concentration: 1 ppb) (Comparative Example 3)

cleaning liquid G1: surfactant G1 containing alkaline cleaning liquid (magnesium concentration: 3 ppb) (Comparative Example 4)

Then, with respect to each of the mask blanks cleaned with the above-mentioned cleaning liquids, dry etching using a fluorine-based ($CF_4$) gas was carried out to remove an anti-reflection layer and then dry etching using a chlorine-based ($Cl_2$) gas was carried out to remove a light-shielding layer.

Then, with respect to a surface of each of the substrates after the etching, the number of convex portions such as micro black defects was measured using a mask blank defect inspection apparatus (M1350: manufactured by Lasertec Corporation). As a result of examining the number of convex portions present on the substrate (measurement region: 132 mm×132 mm), it was 11 in the case of the cleaning liquid A1 (Example 8), 23 in the case of the cleaning liquid B1 (Example 9), 53 in the case of the cleaning liquid C1 (Example 10), 86 in the case of the cleaning liquid D1 (Example 11), 116 in the case of the cleaning liquid E1 (Example 12), 812 in the case of the cleaning liquid F1 (Comparative Example 3), and 1722 in the case of the cleaning liquid G1 (Comparative Example 4). That is, the result was such that as the magnesium concentration in the cleaning liquid became lower, the number of convex portions also became smaller.

Then, there were prepared mask blanks which were different from the above-mentioned mask blanks used in Examples 8 to 12, and Comparative Examples 3 and 4, but had the same film structure as described above. Then, the mask blanks were respectively cleaned using the cleaning liquids A1 to G1 in the same manner as described above. After the cleaning, the mask blanks were subjected to a defect inspection using the mask blank defect inspection apparatus (M1350: manufactured by Lasertec Corporation). As a result of the defect inspection, no defects such as particles or pinholes having a size of 60 nm or more were confirmed on surfaces of the mask blanks.

Then, masks were manufactured using these cleaned mask blanks in the same manner as in Examples 1 to 5 and Comparative Examples 1 and 2.

With respect to the masks thus obtained, a defect inspection was carried out in a transfer pattern forming region (132 mm×104 mm) using a mask defect inspection apparatus (manufactured by KLA-Tencor Corporation). As a result, the number of black defects having a size of 100 nm or less was 2 (cleaning liquid A1: Example 8), 6 (cleaning liquid B1: Example 9), 8 (cleaning liquid C1: Example 10), 21 (cleaning liquid D1: Example 11), 26 (cleaning liquid E1: Example 12), 102 (cleaning liquid F1: Comparative Example 3), and 407 (cleaning liquid G1: Comparative Example 4). Accordingly, in each of the masks manufactured using the mask blanks cleaned with the cleaning liquids A1 to E1, the number of defects was 50 or less, leading to small load of mask defect correction. Thus, the excellent result was obtained. On the other hand, in each of the masks manufactured using the mask blanks cleaned with the cleaning liquids F1 and G1, the number of defects was large, leading to large load of mask defect correction, thus making it practically difficult to carry out the defect correction.

From the results described above, it has been confirmed that as the magnesium concentration in the cleaning liquid increases, the number of micro black defects of the mask also increases. It has also been seen that, in consideration of the load of mask defect correction, a selection should be made from the cleaning liquids A1 to E1 which allow the number of black defects to be 50 or less, as the cleaning liquid of the binary mask blank for ArF excimer laser exposure adapted to the semiconductor design rule DRAM half-pitch 32 nm node.

Examples 13 and 14

Reflective type masks were manufactured in the same manner as in Examples 6 and 7 except that the cleaning liquids A1 and B1 used in Examples 8 and 9 were used.

With respect to the reflective type masks thus obtained, a defect inspection was carried out in a transfer pattern forming region (132 mm×104 mm) using a mask defect inspection apparatus (manufactured by KLA-Tencor Corporation). As a result, the number of black defects having a size of 100 nm or less was 4 in the case of the cleaning liquid A1 (Example 13) and 10 in the case of the cleaning liquid B1 (Example 14). Accordingly, the number of defects was 50 or less, leading to small load of mask defect correction. Thus, the excellent result was obtained.

Example 15

There were prepared a plurality of binary mask blanks for ArF excimer laser exposure adapted to the semiconductor design rule DRAM half-pitch 32 nm node. Each mask blank had, on a synthetic quartz glass substrate with a size of about 152 mm×about 152 mm, a light-shielding film (to be formed into a transfer pattern) having a laminated structure of a TaN light-shielding layer (thickness: 42 nm) substantially composed of tantalum and nitrogen and a TaO antireflection layer (thickness: 9 nm) substantially composed of tantalum and oxygen.

Then, using a plurality of kinds of cleaning liquids having different calcium concentrations, the mask blanks were respectively cleaned. As the cleaning liquids, use was made of cleaning liquid A2: DI water (calcium concentration: 0.001 ppb), cleaning liquid B2: surfactant B2 containing alkaline cleaning liquid (calcium concentration: 0.3 ppb), and cleaning liquid C2: surfactant C2 containing alkaline cleaning liquid (calcium concentration: 3 ppb).

The cleaning of the mask blanks was carried out by spin cleaning. After the cleaning using the cleaning liquid B2, C2, rinsing with the cleaning liquid A2 was also carried out.

Then, with respect to each of the mask blanks respectively cleaned with the cleaning liquids A2, B2, and C2, in the state where a resist film was not formed on the light-shielding film, dry etching using a fluorine-based ($CF_4$) gas was carried out to remove the antireflection layer and then dry etching using a chlorine-based ($Cl_2$) gas was carried out to remove the light-shielding layer.

Then, with respect to a surface of each of the substrates after the etching, convex portion information (number of convex portions and sizes thereof) being one of surface shape information was obtained using a mask blank defect inspection apparatus (M1350: manufactured by Lasertec Corporation). As a result of examining the number of convex portions (convex defects) present on the substrate (measurement region: 132 mm×132 mm), it was 13 in the case of the cleaning liquid A2, 122 in the case of the cleaning liquid B2, and 1768 in the case of the cleaning liquid C2. Thus, the number of convex portions was the least in the case of the cleaning liquid A2.

It can be deemed that, in a region where the convex portion is present, a latent mask blank defect comprising an etching inhibitor, being one cause for the occurrence of a mask black defect, was present before the etching of the thin film. Based on the inspection result, surface shape information that satisfies a desired specification or quality is selected and the treatment liquid corresponding to the selected surface shape information is selected. In this manner, it is possible to select the treatment liquid that can suppress the occurrence of a micro black defect of a mask.

Herein, in consideration of the pattern occupation ratio in a mask, the cleaning liquids A2 and B2 which achieved the number of convex portions being 200 or less were each selected as the cleaning liquid for use in cleaning a mask blank to be formed with a positive resist.

Examples 16 and 17

Then, there were prepared mask blanks which were different from the mask blanks used in selecting the cleaning liquids in Example 15, but had the same film structure as described above. Then, the mask blanks were respectively cleaned using the cleaning liquids A2 and B2 selected in Example 15. After the cleaning using the cleaning liquid B2, rinsing with the cleaning liquid A2 was also carried out. After the cleaning, the mask blanks were subjected to a defect inspection using the mask blank defect inspection apparatus (M1350: manufactured by Lasertec Corporation). As a result of the defect inspection, no defects such as particles or pinholes having a size of 60 nm or more were confirmed on surfaces of the mask blanks.

Then, a chemically amplified positive resist (PRL009: manufactured by FUJIFILM Electronic Materials Co., Ltd.) was spin-coated on the surface of each of the mask blanks cleaned with the cleaning liquids A2 and B2 and then prebaking was carried out, thereby forming a resist film.

Then, the resist film was subjected to writing, development, and rinsing, thereby forming a resist pattern on the tantalum-based mask blank surface. Then, dry etching using a fluorine-based ($CF_4$) gas was carried out using the resist pattern as a mask, thereby patterning an antireflection layer to form an antireflection layer pattern. Then, dry etching using a chlorine-based ($Cl_2$) gas was carried out using the antireflection layer pattern as a mask, thereby patterning a light-shielding layer to form a light-shielding layer pattern. Finally, the resist pattern was removed, thereby forming a mask.

With respect to the masks thus obtained, a defect inspection was carried out in a transfer pattern forming region (132 mm×104 mm) using a mask defect inspection apparatus (manufactured by KLA-Tencor Corporation). As a result, the number of black defects having a size of 100 nm or less was 3 (cleaning liquid A2) and 28 (cleaning liquid B2). Accordingly, the number of defects was 50 or less, leading to small load of mask defect correction. Thus, the excellent result was obtained.

Comparative Example 5

A binary mask blank and a binary mask were manufactured in the same manner as in Examples 16 and 17 except that a mask blank different from the above prepared mask blanks was prepared and that the mask blank was cleaned using the cleaning liquid C2 which was not selected in Example 15. In a defect inspection of the mask blank, no defects such as particles or pinholes having a size of 60 nm or more were confirmed.

On the other hand, in a defect inspection of the mask, many (411) black defects were found. Accordingly, the number of defects was more than 50, leading to large load of mask defect correction, thus making it practically difficult to carry out the defect correction.

Example 18

Like in Example 15, there were prepared a plurality of binary mask blanks for ArF excimer laser exposure adapted to the semiconductor design rule DRAM half-pitch 32 nm node.

Then, using a plurality of kinds of cleaning liquids having different magnesium concentrations, the mask blanks were respectively cleaned. As the cleaning liquids, use was made of cleaning liquid A3: DI water (magnesium concentration: 0.001 ppb), cleaning liquid B3: surfactant B3 containing alkaline cleaning liquid (magnesium concentration: 0.3 ppb), and cleaning liquid C3: surfactant C3 containing alkaline cleaning liquid (magnesium concentration: 3 ppb).

The cleaning of the mask blanks was carried out by spin cleaning. After the cleaning using the cleaning liquid B3, C3, rinsing with the cleaning liquid A3 was also carried out.

Then, with respect to each of the mask blanks respectively cleaned with the cleaning liquids A3, B3, and C3, a thin film was removed in the same manner as in Example 15.

Then, with respect to a surface of each of the substrates after the removal of the thin film by etching, convex portion information (number of convex portions and sizes thereof) being one of surface shape information was obtained using a mask blank defect inspection apparatus (M1350: manufactured by Lasertec Corporation). As a result of examining the number of convex portions (convex defects) present on the substrate (measurement region: 132 mm×132 mm), it was 11 in the case of the cleaning liquid A3, 116 in the case of the cleaning liquid B3, and 1708 in the case of the cleaning liquid C3. Thus, the number of convex portions was the least in the case of the cleaning liquid A3.

It can be deemed that, in a region where the convex portion is present, a latent mask blank defect comprising an etching inhibitor, being one cause for the occurrence of a mask black defect, was present before the etching of the thin film. Based on the inspection result, surface shape information that satisfies a desired specification or quality is selected and the treatment liquid corresponding to the selected surface shape information is selected. In this manner, it is possible to select the treatment liquid that can suppress the occurrence of a micro black defect of a mask.

Herein, in consideration of the pattern occupation ratio in a mask, the cleaning liquids A3 and B3 which achieved the number of convex portions being 200 or less were each selected as the cleaning liquid for use in cleaning a mask blank to be formed with a positive resist.

Examples 19 and 20

Then, there were prepared mask blanks which were different from the mask blanks used in selecting the cleaning liquids in Example 18, but had the same film structure as described above. Then, the mask blanks were respectively cleaned using the cleaning liquids A3 and B3 selected in Example 18. After the cleaning using the cleaning liquid B3, rinsing with the cleaning liquid A3 was also carried out. After the cleaning, the mask blanks were subjected to a defect inspection using the mask blank defect inspection apparatus (M1350: manufactured by Lasertec Corporation). As a result of the defect inspection, no defects such as particles or pinholes having a size of 60 nm or more were confirmed on surfaces of the mask blanks.

Then, masks were manufactured in the same manner as in Examples 16 and 17 using the mask blanks respectively cleaned using the cleaning liquids A3 and B3.

With respect to the masks thus obtained, a defect inspection was carried out in a transfer pattern forming region (132 mm×104 mm) using a mask defect inspection apparatus (manufactured by KLA-Tencor Corporation). As a result, the number of black defects having a size of 100 nm or less was 2 (cleaning liquid A3) and 22 (cleaning liquid B3). Accordingly, the number of defects was 50 or less, leading to small load of mask defect correction. Thus, the excellent result was obtained.

Comparative Example 6

A binary mask blank and a binary mask were manufactured in the same manner as in Examples 19 and 20 except that a mask blank different from the above prepared mask blanks was prepared and that the mask blank was cleaned using the cleaning liquid C3 which was not selected in Example 18. In a defect inspection of the mask blank, no defects such as particles or pinholes having a size of 60 nm or more were confirmed.

On the other hand, in a defect inspection of the mask, many (402) black defects were found. Accordingly, the number of defects was more than 50, leading to large load of mask defect correction, thus making it practically difficult to carry out the defect correction.

While this invention has been described with reference to the embodiment and Examples, the technical scope of the invention is not limited to the scope of the description of the above-mentioned embodiment and Examples. It is obvious to those skilled in the art that various changes or improvements can be added to the above-mentioned embodiment and Examples. It is clear from the description of claims that the modes added with such changes or improvements can also be included in the technical scope of this invention.

What is claimed is:

1. A mask blank surface treatment method for surface-treating, using a treatment liquid, a surface of a thin film, to be formed into a transfer pattern, of a mask blank having the thin film on a substrate,
wherein the thin film is made of a material containing tantalum,
the thin film comprises a surface layer made of a material containing tantalum and oxygen,
the surface layer is treated with the treatment liquid in surface treatment of the thin film,
the treatment liquid contains etching inhibitor, and
a concentration of an etching inhibitor contained in the treatment liquid is 0.3 ppb or less.

2. The mask blank surface treatment method according to claim 1, wherein the etching inhibitor is a material containing at least one selected from calcium, magnesium, iron, copper, manganese, aluminum, and compounds thereof.

3. The mask blank surface treatment method according to claim 1, wherein the etching inhibitor is a material containing at least one selected from calcium, magnesium, aluminum, and compounds thereof.

4. The mask blank surface treatment method according to claim 1, wherein the material of the thin film can be etched with a dry etching gas in the form of a fluorine-based gas or a chlorine-based gas substantially free of oxygen.

5. The mask blank surface treatment method according to claim 1, wherein the treatment liquid is a cleaning liquid.

6. The mask blank surface treatment method according to claim 5, wherein the cleaning liquid contains a surfactant.

7. The mask blank surface treatment method according to claim 5, wherein the cleaning liquid is deionized water.

8. A mask blank manufacturing method comprising
a step of preparing a mask blank having on a substrate a thin film to be formed into a transfer pattern, and
a surface treatment step of surface-treating a surface of the thin film using a treatment liquid,
wherein the thin film is made of a material that can be etched by ion-based dry etching, and
the surface treatment step is carried out by the mask blank surface treatment method according to claim 1.

9. A mask manufacturing method that manufactures a mask by patterning the thin film of the mask blank manufactured by the mask blank manufacturing method according to claim 8.

10. A mask blank surface treatment method for surface-treating, using a treatment liquid, a surface of a thin film, to be formed into a transfer pattern, of a mask blank having the thin film on a substrate,
wherein the thin film is a laminated film in which a tantalum nitride film and a tantalum oxide film are laminated together,
the tantalum nitride film containing tantalum and nitrogen,
the tantalum oxide film containing tantalum and oxygen,
the surface of the tantalum oxide film is treated with the treatment liquid in surface treatment of the thin film,
the treatment liquid contains etching inhibitor, and
a concentration of an etching inhibitor contained in the treatment liquid is 0.3 ppb or less.

11. The mask blank surface treatment method according to claim 10, wherein the etching inhibitor is a material containing at least one selected from calcium, magnesium, iron, copper, manganese, aluminum, and compounds thereof.

12. The mask blank surface treatment method according to claim 10, wherein the etching inhibitor is a material containing at least one selected from calcium, magnesium, aluminum, and compounds thereof.

13. The mask blank surface treatment method according to claim 10, wherein the material of the thin film can be etched with a dry etching gas in the form of a fluorine-based gas or a chlorine-based gas substantially free of oxygen.

14. The mask blank surface treatment method according to claim 10, wherein the treatment liquid is a cleaning liquid.

15. The mask blank surface treatment method according to claim 14, wherein the cleaning liquid contains a surfactant.

16. The mask blank surface treatment method according to claim 14, wherein the cleaning liquid is deionized water.

17. A mask blank manufacturing method comprising
a step of preparing a mask blank having on a substrate a thin film to be formed into a transfer pattern, and
a surface treatment step of surface-treating a surface of the thin film using a treatment liquid,
wherein the thin film is made of a material that can be etched by ion-based dry etching, and
the surface treatment step is carried out by the mask blank surface treatment method according to claim 10.

18. A mask manufacturing method that manufactures a mask by patterning the thin film of the mask blank manufactured by the mask blank manufacturing method according to claim 17.

* * * * *